United States Patent

Haneta

[15] 3,649,884

[45] Mar. 14, 1972

[54] FIELD EFFECT SEMICONDUCTOR DEVICE WITH MEMORY FUNCTION

[72] Inventor: Yuichi Haneta, Tokyo, Japan

[73] Assignee: Nippon Electric Company, Limited, Minato-ku, Tokyo, Japan

[22] Filed: June 2, 1970

[21] Appl. No.: 42,685

[30] Foreign Application Priority Data

June 6, 1969 Japan....................................44/43978

[52] U.S. Cl....................317/235 R, 317/235 B, 317/235 AG

[51] Int. Cl...........................................................H01l 11/14

[58] Field of Search.........................317/235 B, 235 AG, 235

[56] References Cited

UNITED STATES PATENTS 3,500,142 3/1970 Kahng....................................317/235

FOREIGN PATENTS OR APPLICATIONS 813,537 5/1969 Canada..................................317/235

*Primary Examiner*—John W. Huckert
*Assistant Examiner*—Martin H. Edlow
*Attorney*—Sandoe, Hopgood and Calimafde

[57] ABSTRACT

A field effect transistor is provided with a gate assembly comprising a sandwich of a layer of silicon oxide with excess silicon between two insulating films of appropriate thickness for the entrapment of charge carriers in the silicon-rich silicon oxide layer. Such entrapment provides the transistor with information storage capabilities in which information can be stored for a long time and readily erased or modified.

4 Claims, 2 Drawing Figures

INVENTOR
Yuichi Haneta
by
Sandoe, Hopgood & Calimafde
ATTORNEYS

FIELD EFFECT SEMICONDUCTOR DEVICE WITH MEMORY FUNCTION

BACKGROUND OF THE INVENTION

This invention relates to memory storing devices, and more particularly to field effect semiconductor devices which can trap charge carriers and featured by a relatively long memory whereby an induced electric field can be maintained in the device for a useful period of time even after the field inducing force is removed.

There have been suggested several types of insulated-gate field effect transistors having a memory function by the use of trapped charge carriers in the gate assembly of the transistor. One transistor of this type has a gate insulator layer consisting of alumina. In this transistor, however, storage information cannot readily be erased or modified. Moreover, a threshold gate voltage of this transistor always shifts toward a positive direction, irrespective of the polarity of the signal applied to the gate electrode.

In computers and related apparatus there exists a demand for a memory element in which information can be stored temporarily and can readily erased or modified. Such a demand may be satisfied by other types of insulated-gate field effect transistors in which the gate insulator assemblies consist of silicon oxide - silicon nitride and silicon oxide - zirconium - zirconium oxide. In these types of transistors, however, another inconvenience arises in that a high gate voltage above 10 volts is necessary for storing information in the transistors. Therefore, there is still a need for a temporary memory element operating at a low gate voltage.

SUMMARY OF THE INVENTION

This invention provides a field effect semiconductor device which comprises a semiconductor substrate, a silicon oxide layer formed on at least a part of the surface of the semiconductor substrate, a layer of silicon oxide containing excess silicon formed on the first silicon oxide layer, an insulator layer formed on the second layer, and a metallic electrode formed on the last insulator layer.

In the field effect semiconductor device of this invention using a layer of silicon oxide containing excess silicon (hereinafter referred to as "the silicon-rich silicon oxide layer"), electrons are released from the silicon-rich silicon oxide layer and injected into the semiconductor substrate by a negative voltage pulse applied to the gate electrode. As a result, excess electrons are accumulated for a long period of time in the surface portion of the semiconductor substrate beneath the first silicon oxide layer, and hence the surface portion is to N-type in the case of the substrate being of P-type semiconductor, or to $N^+$-type when the substrate is of the N-type. The application of a positive pulse to the gate electrode instead causes the injection of electrons from the semiconductor substrate into the silicon-rich silicon oxide layer and the entrapment of electrons in the latter layer for a long period of time, which results in the conversion of the conductivity type of the surface portion of the substrate underlying the gate assembly from N-type to P-type or from P-type to $P^+$-type.

In other words, by applying a voltage pulse or a series of voltage pulses in a certain repetition period having a certain level to the gate electrode, the surface portion beneath the gate assembly changes its conductivity type and the path between the source and drain becomes conductive for a relatively long period of time. On the other hand, by applying a voltage pulse of the reverse polarity, the path between the source and drain becomes cutoff. These operations represent the writing of information in a memory element. In the field effect device of this invention, the stored information can be erased only by applying a reverse voltage pulse having a polarity opposite to that of the pulse used for writing-in information to the gate electrode. The voltage level of the pulses applied to the gate electrode may be lower than that required for the prior art devices, that is less than 10 volts. Thus, this invention provides a novel insulated-gate type field effect semiconductor device having a temporary memory function and operating with a lower gate voltage.

In the device of this invention, the second layer of the gate insulator assembly consists of amorphous silicon dioxide ($SiO_2$) containing excess silicon. It is believed that the excess silicon exists in the layer in the form of silicon atoms or clusters of silicon atoms. In this layer, the effective content of silicon as a whole is 50 to 80 percent by weight. For the purpose of the effective memory function, the thickness of the silicon-rich silicon oxide layer should advantageously be in the range of 1,000 to 2,000 angstroms. This layer may be formed by a gas-phase deposition process, such as that described in a copending application Ser. No. 763,152 filed on Sept. 27, 1968 by Yuichi Haneta et al., assigned to the same assignee as this application and entitled "Semiconductor Device with Hysteretic Capacity vs. Voltage Characteristics."

The first, or lowermost layer of the gate insulator assembly is of stoichiometric silicon dioxide ($SiO_2$) and may be produced by the thermal oxidation of silicon substrate. Other deposition methods may also be employed, particularly where a semiconductor substrate other than silicon is used. This first layer is preferably 10 to 100 angstroms in thickness.

The uppermost layer of the insulator assembly is of stoichiometric silicon dioxide ($SiO_2$) of between 100 to 1,000 angstroms thickness which may be formed by way of deposition from gas phase of, e.g., $SiCl_4$—$H_2O$ system or $SiH_4$—$NO_2$ system. Instead of silicon dioxide, alumina ($Al_2O_3$) or silicon nitride (which may be expressed as $Si_3N_4$) each of 100 to 1,000 angstroms thick can be employed. In this case, it is possible to reduce the voltage level of pulses for write-in and readout of information.

In the field effect memory device of the invention, the voltage pulse to be applied to the gate electrode for a write-in of information may be in the range of 5 to 40 volts in magnitude and several hundred nano-seconds to 60 seconds in pulse width. The written information may be stored in the device for more than 1,000 hours. The storage time depends on the thickness of the lowermost silicon dioxide layer and can be as long as 10 years or more.

DESCRIPTION OF THE PREFERRED EMBODIMENT

Figure 1:
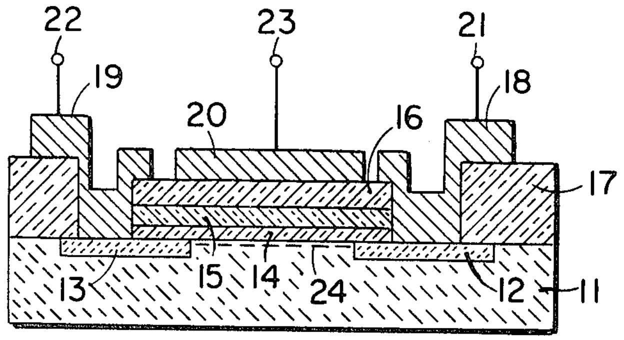
FIG. 1 is a schematic cross-sectional view of a field effect memory transistor according to a preferred embodiment of this invention.

Referring to FIG. 1, an N-type source region 12 and an N-type drain region 13 are formed in a P-type silicon substrate 11 by the selective diffusion method. A silicon oxide layer 17 of about 1.4 micron thickness is formed thereon by thermal oxidation. Layer 17 is selectively removed by a photo-etching process at positions of a gate assembly and of the source and drain electrodes. A silicon dioxide film 14 of 10 to 100 angstrom thick is then newly formed by thermal oxidation, which works as a barrier to the injection of electrons in operation and hence needs to be quite thin. Thereupon, a second oxide layer 15 of 1,000 to 2,000 angstroms in thickness is deposited through a reaction at 900° C. of silane ($SiH_4$) and water vapor ($H_2O$) in the volume ratio of $H_2O/SiH_4<10$. The silicon oxide layer 15 thus formed contains excess silicon. Further, a silicon nitride film 16 of 1,000 angstroms thick is grown thereupon by a reaction of silane ($SiH_4$) and nitrogen peroxide ($NO_2$). A gate insulator assembly of 2,000 to 3,000 angstroms in thickness is fabricated.

Thereafter, windows for receiving the source and drain electrodes are formed in the silicon oxide film by a photo-etching method, and a source electrode 18 and a drain electrode 19, both preferably formed of aluminum, are provided therein. At the same time, a gate electrode 20 of aluminum is formed.

In operation, when a negative voltage pulse is applied to the gate electrode terminal 23, electrons are released from the excess silicon in the silicon-rich silicon oxide layer 15, moved through the silicon dioxide film 14 by tunneling to the silicon substrate 11, and are accumulated in the surface portion 24 of the P-type substrate 11, which results in a change in the conductivity type of the portion 24 to N-type. As a result, the path between source 12 and drain 13 becomes conductive. On the other hand, when a positive voltage pulse is applied to the gate electrode terminal, electrons in the silicon substrate 11 are moved passing through the oxide film 14 by tunneling and are trapped in the silicon-rich oxide layer 15, whereby the surface portion 24 of silicon changes to $P^+$-type and the path between source 12 and drain 13 is cut off more completely. The silicon nitride film 16 works to prevent electrons from being injected from the gate electrode 20 to the gate insulator assembly or from the silicon-rich oxide layer 15 to the gate electrode 20.

Figure 2:
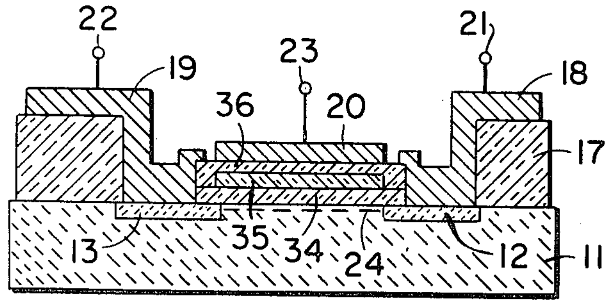
FIG. 2 is a schematic cross-sectional view of a modified structure of the transistor of FIG. 1.

Referring to FIG. 2 in which the same reference numerals indicate the same portions as the device of FIG. 1, there is shown a modified structure improving the gate insulator assembly. In detail, the silicon-rich oxide layer 35 of the embodiment of FIG. 2 is completely covered with the silicon oxide film 34 and the silicon nitride film 36.

The field effect transistors as described above can be operated by applying a voltage pulse of ±40 volts or less for about 1 microsecond or more to the gate electrode.

The above description of the preferred embodiments is directed only to field effect transistors embodying this invention. However, it should be apparent that this invention can be extended to other forms of semiconductor devices such as field effect diodes and integrated circuit devices where it is desired to maintain an induced electric field even after the inducing force is removed.

Accordingly, it is to be understood that the embodiment described above are only illustrative of the invention and other embodiments and modifications may be devised within the spirit and scope of the invention.

What is claimed is:

1. An insulated gate field effect transistor comprising a semiconductor substrate of one polarity type, a source and a drain region of an opposite polarity type formed in said substrate, a silicon dioxide film formed on said substrate and extending over a portion of the upper surfaces of said source and drain regions, a layer of amorphous silicon dioxide containing excess silicon having a silicon content of 50–80 percent by weight formed on said silicon dioxide film, an insulator film formed of a substance selected from the group consisting of silicon dioxide, silicon nitride and alumina over said excess silicon containing silicon dioxide layer, a gate electrode formed on said insulator film, and source and drain electrodes respectively contacting a portion of the upper surfaces of said source and drain regions uncovered by said silicon dioxide film.

2. The insulated gate field effect transistor of claim 1, in which said silicon dioxide film includes end regions extending beyond the end walls of said silicon dioxide layer, said insulator film extending over the upper surface of said silicon dioxide layer and extending vertically to enclose the side walls of said silicon dioxide layer and to contact the end regions of said silicon dioxide film.

3. The semiconductor device of claim 6 in which said insulator film has a thickness from 100 to 1,000 angstroms.

4. The semiconductor device claimed in claim 1, in which said insulator film is formed of silicon nitride.

* * * * *